(12) United States Patent
Gould et al.

(10) Patent No.: US 6,493,859 B1
(45) Date of Patent: Dec. 10, 2002

(54) METHOD OF WIRING POWER SERVICE TERMINALS TO A POWER NETWORK IN A SEMICONDUCTOR INTEGRATED CIRCUIT

(75) Inventors: Scott W. Gould, South Burlington, VT (US); Philip S. Honsinger; Andrew D. Huber, both of Poughkeepsie, NY (US); Patrick M. Ryan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,641

(22) Filed: Oct. 1, 2001

(51) Int. Cl.[7] ............................................... G06F 17/50

(52) U.S. Cl. ........................ 716/12; 455/13.4; 455/427; 174/50; 361/627; 716/19

(58) Field of Search .......................... 455/13.4; 174/50; 361/627; 716/8, 12–14, 17, 19

(56) References Cited

U.S. PATENT DOCUMENTS

| | | | | |
|---|---|---|---|---|
| 4,295,149 A | * | 10/1981 | Balyoz et al. | 716/19 |
| 5,675,194 A | * | 10/1997 | Domigan | 174/50 |
| 5,924,015 A | * | 7/1999 | Garrison et al. | 455/13.4 |

* cited by examiner

Primary Examiner—Matthew Smith
(74) Attorney, Agent, or Firm—Schmeiser, Olsen & Watts; Richard M. Kotulak (57) ABSTRACT

Disclosed is a method of routing power from a power network to one or more power service terminals within a voltage island, comprising: dividing the power network into segments; creating power service terminal to segment connections based on a first set of criteria; removing selected power service terminal to segment connections based on a second set of criteria; and selecting one power service terminal to segment connection for each the power service terminal. The first criteria is includes power drop, wire length, wire size, wiring layer restrictions and the second criteria includes electro-migration, wire length and current criteria.

21 Claims, 11 Drawing Sheets

METHOD OF WIRING POWER SERVICE TERMINALS TO A POWER NETWORK IN A SEMICONDUCTOR INTEGRATED CIRCUIT

BACKGROUND OF THE INVENTION

1. Field of the Invention

The present invention relates to the field of integrated circuit design; more specifically, it relates to a method for distributing power in an integrated circuit.

2. Background of the Invention

In an effort to increase performance, lower power consumption and integrate several integrated circuit technologies on the same chip, the concept of voltage islands has been introduced into integrated circuit design.

The voltage island concept allows for one or more portions of an integrated chip (islands) to be powered by both a chip wide power source (VDDg) and one or more additional, voltage island power sources (VDDi through VDDn.) VDDg and VDDi through VDDn can be switched on and off by the user as the operation of the integrated circuit demands. VDDg, VDDi through VDDn and also GND are supplied to the voltage island from separate chip wide power sources.

Efficiently designing power connections to voltage island circuits from VDDg, VDDi through VDDn and GND is a significant concern. Problems to be overcome include how not to require an overabundance of power wires to anticipate the power needs of unplaced voltage islands, how not to restrict placement of power service terminals (PST's) contained within the voltage island circuits, because of a locally sparse power grid, how to avoid IR and electro-migration viloations and generally how to avoid blocked pins and other wireability issues.

SUMMARY OF THE INVENTION

A first aspect of the present invention is a method of routing power from a power network to one or more power service terminals within a voltage island, comprising: dividing the power network into segments; creating power service terminal to segment connections based on a first set of criteria; removing selected power service terminal to segment connections based on a second set of criteria; and selecting one power service terminal to segment connection for each the power service terminal.

A second aspect of the present invention is a computer system comprising a processor, an address/data bus coupled to the processor, and a computer-readable memory unit coupled to communicate with the processor, the memory unit containing instructions that when executed implement a method for routing power from a power network to one or more power service terminals within a voltage island, the method comprising the computer implemented steps of: dividing the power network into segments; creating power service terminal to segment connections based on a first set of criteria; removing selected power service terminal to segment connections based on a second set of criteria; and selecting one power service terminal to segment connection for each the power service terminal.

A third aspect of the present invention is a program storage device readable by machine, tangibly embodying a program of instructions executable by the machine to perform method steps for routing power from a power network to one or more power service terminals within a voltage island the method steps comprising: dividing the power network into segments; creating power service terminal to segment connections based on a first set of criteria; removing selected power service terminal to segment connections based on a second set of criteria; and selecting one power service terminal to segment connection for each the power service terminal.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
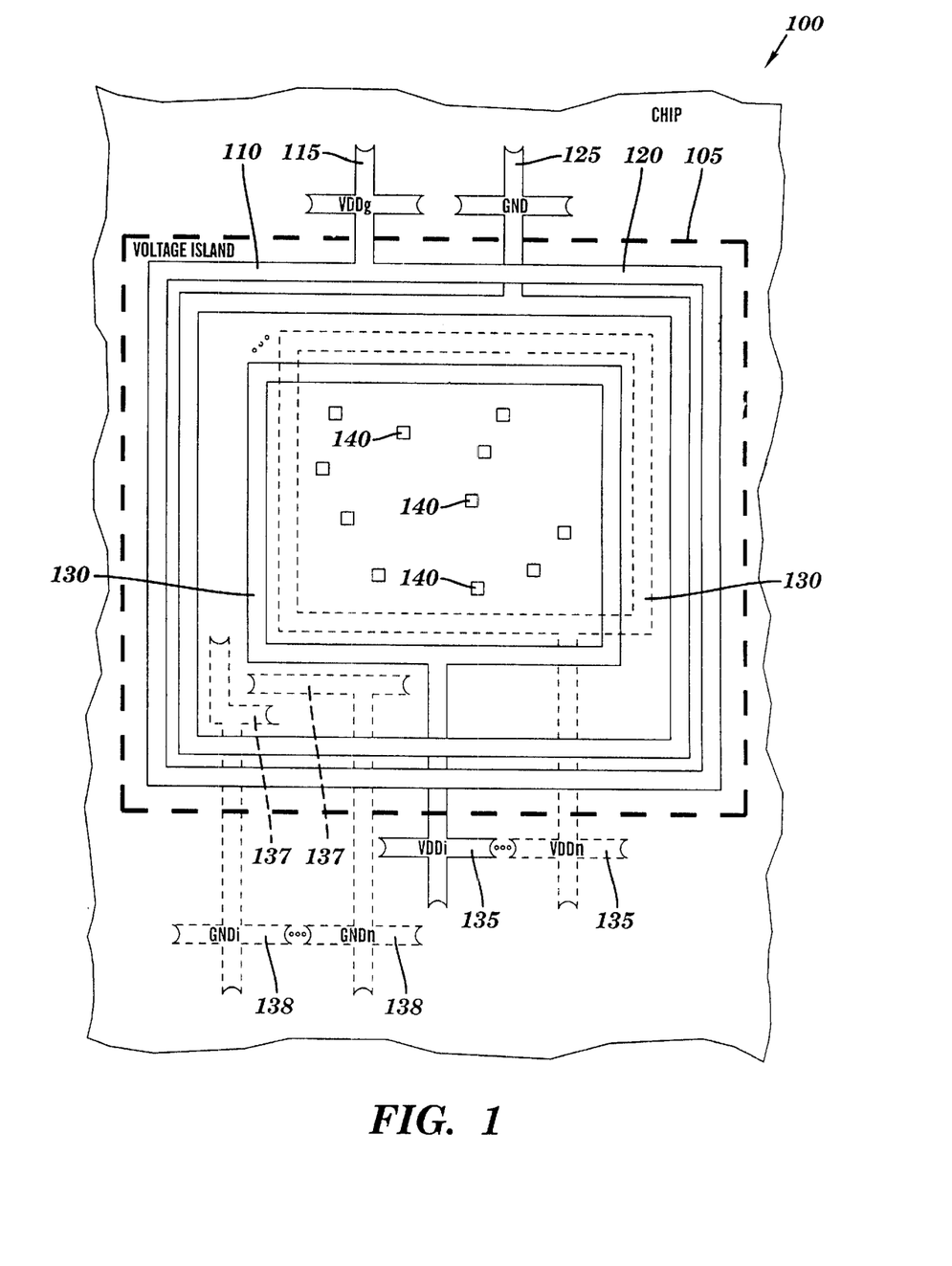
FIG. 1 is schematic diagram of an integrated circuit chip including a voltage island according to the present invention.

FIG. 1 is schematic diagram of an integrated circuit chip including a voltage island according to the present invention. In FIG. 1, integrated circuit chip 100 includes a voltage island 105. Voltage island 105 includes a VDDg power network 110 supplied from chip VDDg power grid 115, a GND power network 120 supplied from chip GND power grid 125, one or more VDDi through VDDn power networks 130 supplied from either on-chip VDDi through VDDn power grids 135 or one or more off-chip power sources and optionally one or more GNDi through GNDn power networks 137 supplied from either on-chip GNDi through GNDn power grids 138 or one or more off-chip power sources. Voltage island 105 also includes a multiplicity of PST's 140 which supply power to circuits and devices contained in the voltage island and must be connected to VDDg, VDDi through VDDn and GND.

In the present example, VDDg power network 110, GND power network 120 and VDDi through VDDn power networks 130 are power rings. The present invention is applicable to other types of power networks, such as grids, as well.

Figure 2:
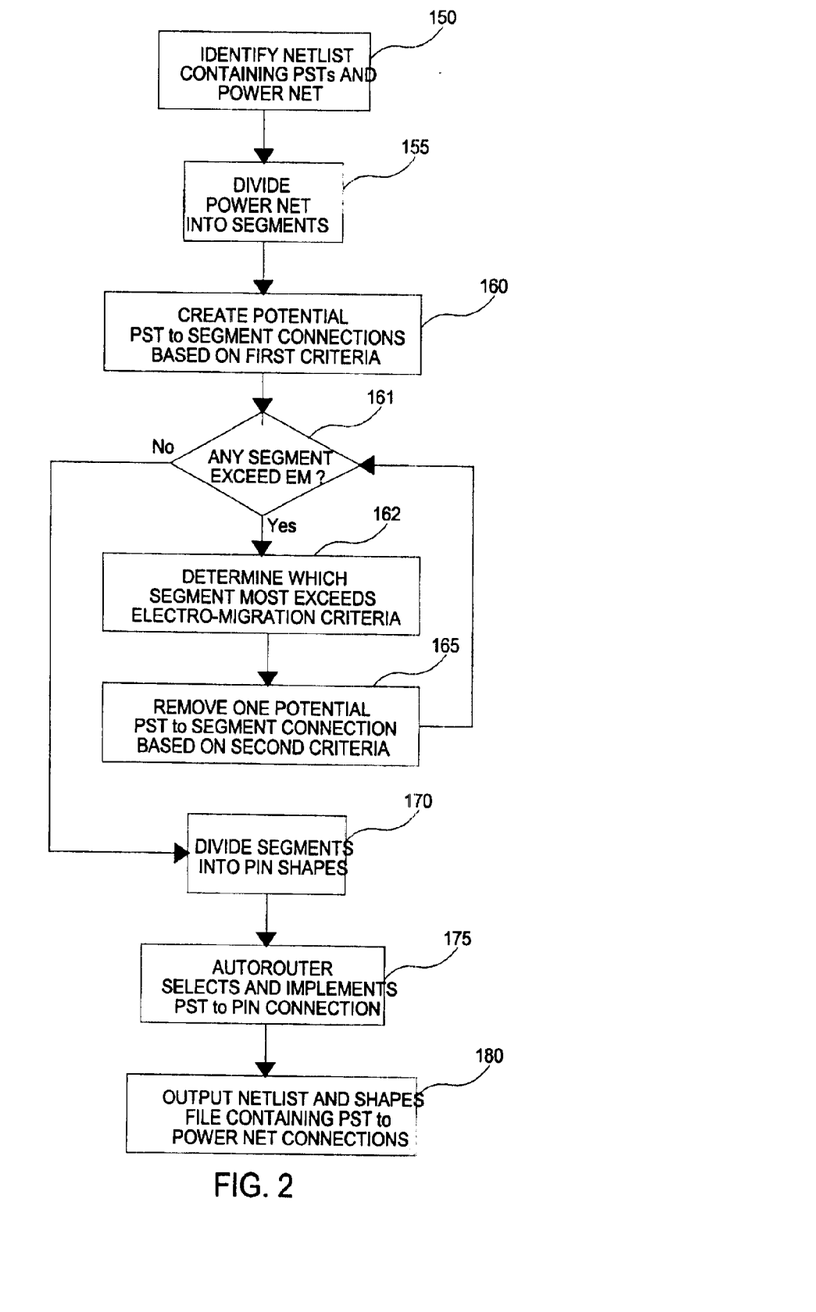
FIG. 2 is a flowchart of the method of wiring power service terminals to a power grid in a semiconductor integrated circuit according to the present invention.

FIG. 2 is a flowchart of the method of wiring power service terminals to a power grid in a semiconductor integrated circuit according to the present invention. In step 150, a netlist containing a power network and PST's to be connected to the power network is identified.

In step 155, the power network is divided into segments. The number of segments is determined by user requirements. The more segments, the more accurate the final routing of connections will be, but the overall process will take longer. There must be at least as many segments as there are PST's. About 3 to 5 times as many segments as the number of PST's may be used as a guideline.

In step 160, potential PST to segment connections are created. Each segment is labeled with the amount of current it can carry and each PST is labeled with the amount of current the PST requires. Any PST may be potentially connected to any segment provided the segment can provide sufficient current to the PST and the PST/segment pair does not exceed the maximum allowable IR drop. Additionally potential PST to segment connections may be limited by the following first set of criteria: wire length, minimum and maximum wire size and wiring layer usage restrictions. This step may result in more than one PST being potentially connected to the same segment, and the same PST being potentially connected to more than one segment.

In step 161, it is determined if any segments exceed an electro-migration criteria. Electro-migration is the current induced formation of voids in wires that lead to voltage drops and eventually catastrophic open failures in the wire. An electro-migration criterion is essentially a limit of the amount of current wires making up various segments are allowed to carry.

If in step 161, it is determined that one or more segments exceed the electro-migration criteria then in step 162 it is determined which segment most exceeds the electro-migration criteria and one potential PST to segment connection to that segment is eliminated. The elimination process is based on the following second set of criteria: wire length and current through the potential PST to segment connection. The longest wire length and/or highest current connection being eliminated. The method then loops back to step 161.

If in step 161, it is determined that no segments exceed the electro-migration criteria then the method proceeds to step 170.

In step 170, the segments are further divided into pin shapes and the potential PST to segment connections are converted to potential PST to pin shape connections such that no more than one PST is connected to any given pin shape. For example if there are two PST's connected to a segment, then the segment is divided into two pins shapes, if there are three PST's connected to the segment, then the segment is divided into three pin shapes. The PST's are assigned to pin shapes based on shortest wire length. More than one potential PST to pin shape connection may exist for any given PST. This step is necessary only because of limitations of current router technology.

In step 175, an auto-router is used to select and implement one actual PST to pin shape connection for each PST from all the potential PST to pin shape connections for each PST. The auto-router is instructed to route a number of networks equal to the number of PST's instead of the usual single network. The router algorithm may include, but is not limited to: wireability, ultimate wire length, degrees of freedom (make connections as small as possible) and favoring straight wires or wires with bends. Examples of routers include: X-Router by IBM Corp. (Armonk, N.Y.) and Bonn University (Bonn, Germany), LGWire (internal to IBM Corp.) and commercially available routers such as Warp by Cadence (Ca.).

Finally, in step 180, an augmented netlist and a shapes file is outputted containing PST's, the power network and a routed connection for each PST to the power network.

Figure 3:
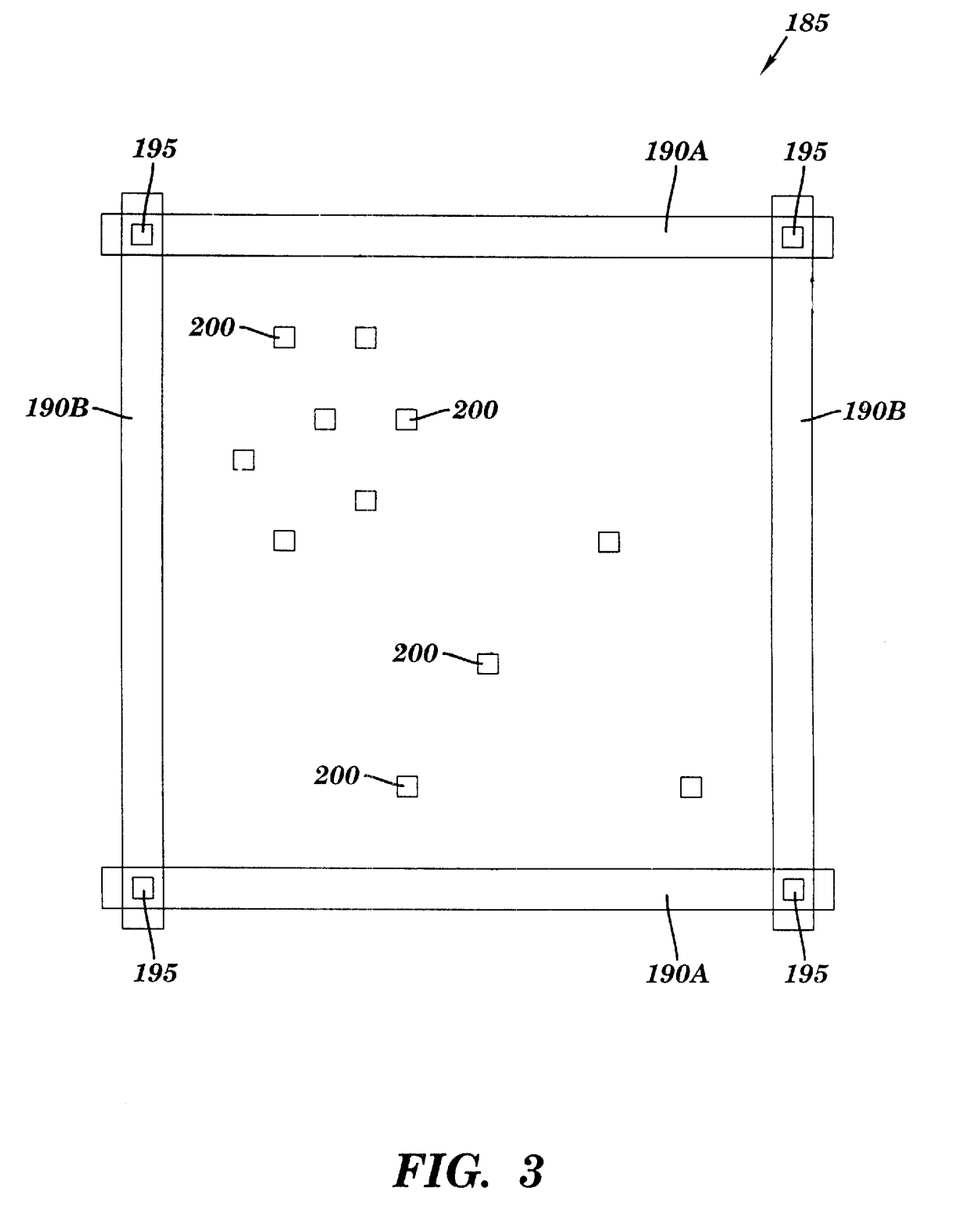
FIG. 3 is a schematic diagram, illustrating step 150 of FIG. 2 according to the present invention.

FIGS. 3 through 9 illustrate the method of FIG. 2 wherein the power network is a power ring. FIG. 3 is a schematic diagram, illustrating step 150 of FIG. 2 according to the present invention. In FIG. 3, a power ring 185 comprises two parallel sections 190A joined to two perpendicular sections 190B by vias 195 located at the ends of the sections. Typically, in a multilevel design, sections 190A may be physically placed at wiring levels M1, M3 or M5 and sections 190B may be physically placed at wiring levels M2, M4 or M6. Within ring 185 are a multiplicity of PST's 200.

Figure 4:
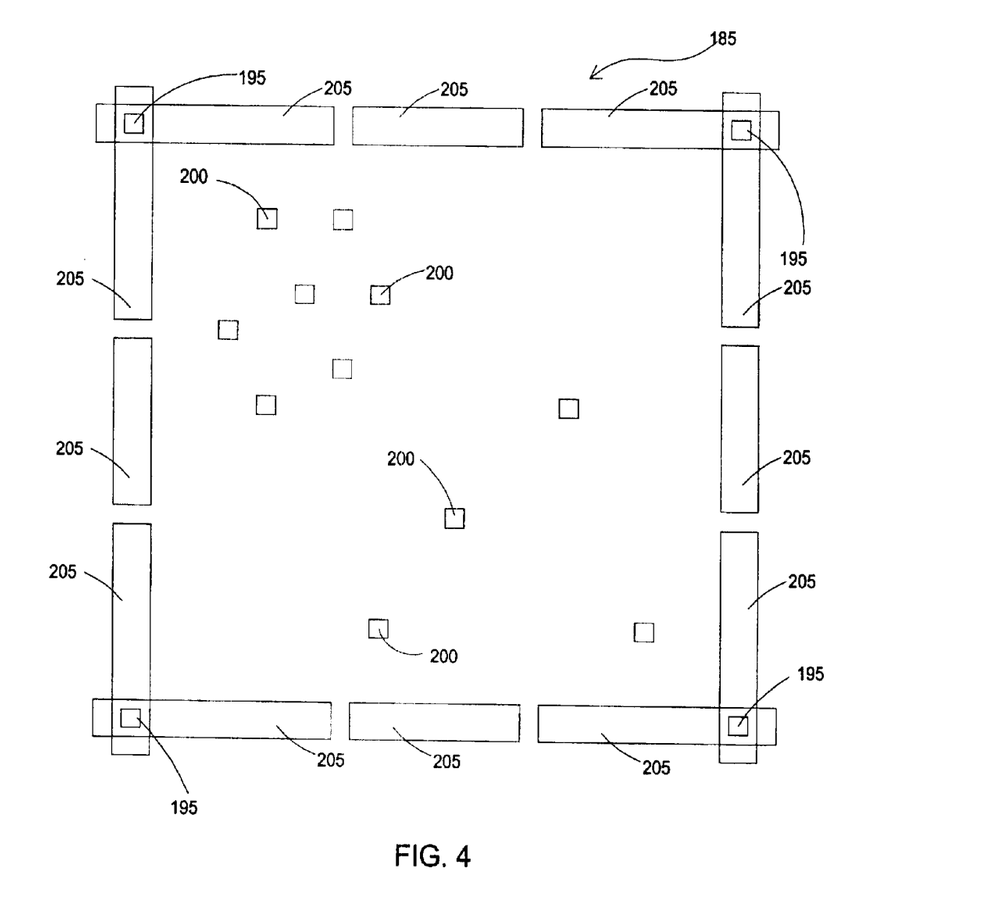
FIG. 4 is a schematic diagram, illustrating step 155 of FIG. 2 according to the present invention.

FIG. 4 is a schematic diagram, illustrating step 155 of FIG. 2 according to the present invention. In FIG. 4, sections 190A and 190B are divided into segments 205. In the present example, each section 190A and 190B is divided into three segments.

Figure 5:
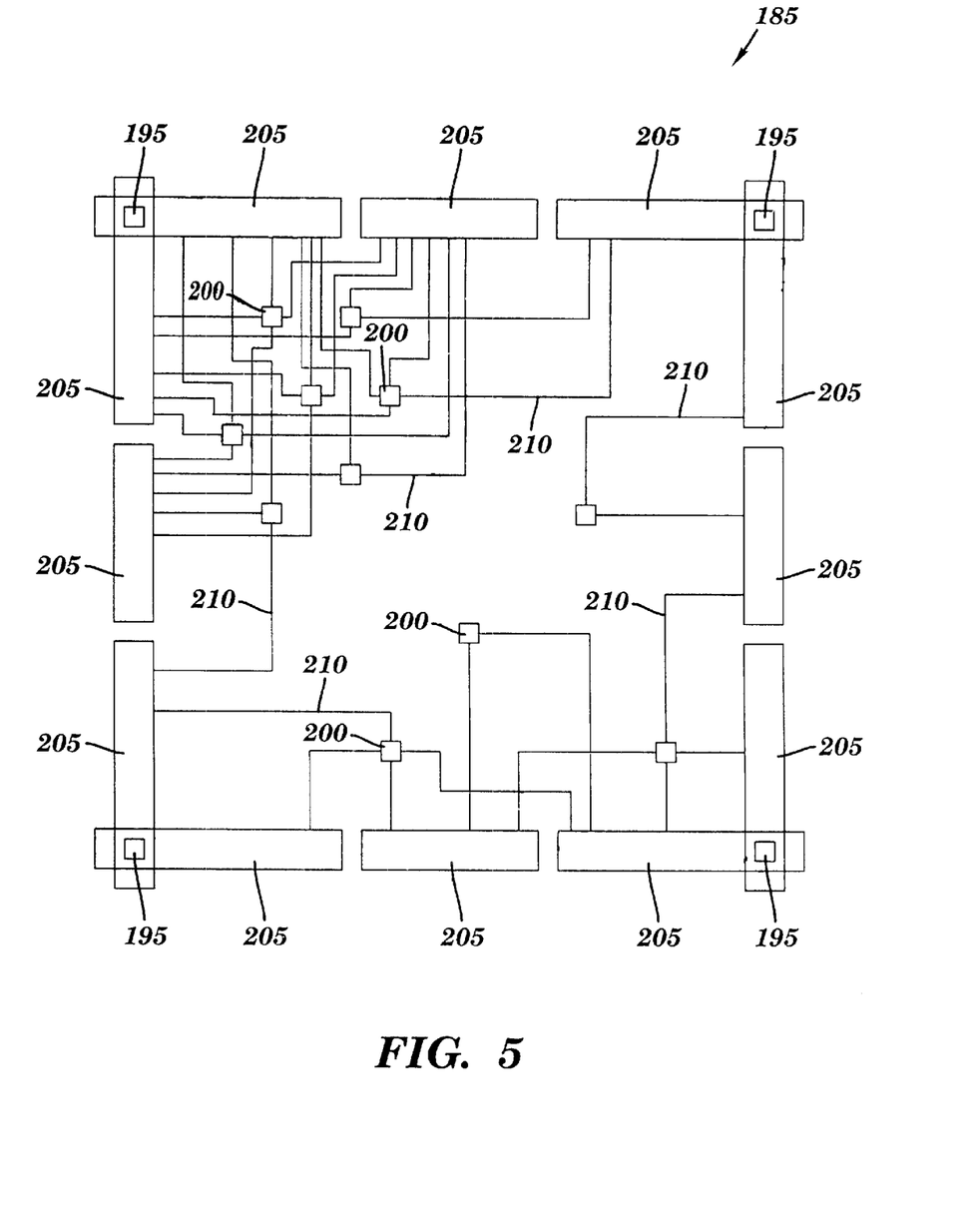
FIG. 5 is a schematic diagram, illustrating step 160 of FIG. 2 according to the present invention.

FIG. 5 is a schematic diagram, illustrating step 160 of FIG. 2 according to the present invention. In FIG. 5, potential PST to segment connections 210 are created. Because of allowable IR drop, wire length, minimum and maximum wire size and wiring layer usage restrictions, not all PST's 200 are potentially wired to all segments 205. In this example, these restrictions result in the minimum number of segments a given PST is potentially connected to is two and the maximum is four. The minimum number of PST's potentially connected to a segment is one and the maximum is six. There are 37 potential PST to segment connections 210 for the eleven PST's 200.

Figure 6:
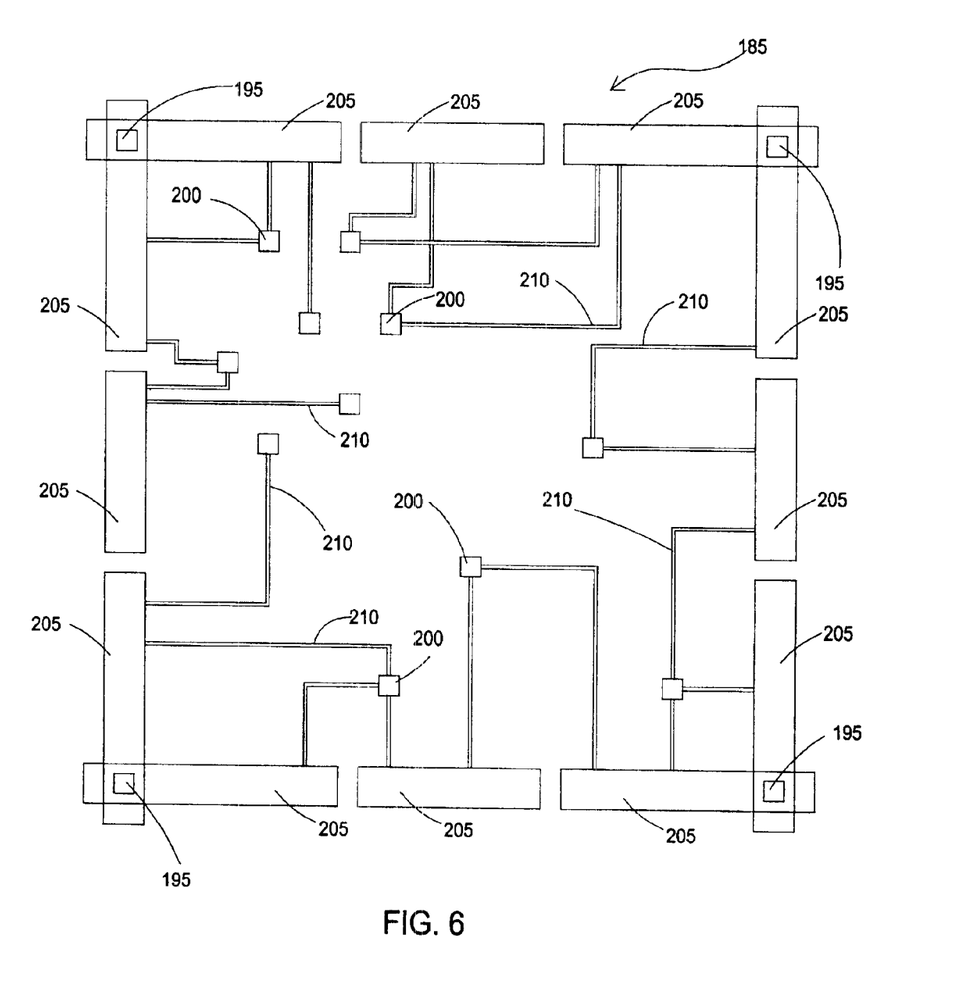
FIG. 6 is a schematic diagram, illustrating steps 161 through 165 of FIG. 2 according to the present invention.

FIG. 6 is a schematic diagram, illustrating steps 161 through 165 of FIG. 2 according to the present invention. In FIG. 6, some of potential PST to segment connections 210 are eliminated by applying electro-migration criteria and current and wire length criteria as described above and illustrated in steps 161 through 165 of FIG. 2. In this example, these electro-migration criteria result in the minimum number of segments a given PST is potentially connected to is one and the maximum is three. The minimum number of PST's 200 potentially connected to a segment is still one but the maximum is reduced to two. There are only 21 potential PST to segment connections 210 left.

Figure 7:
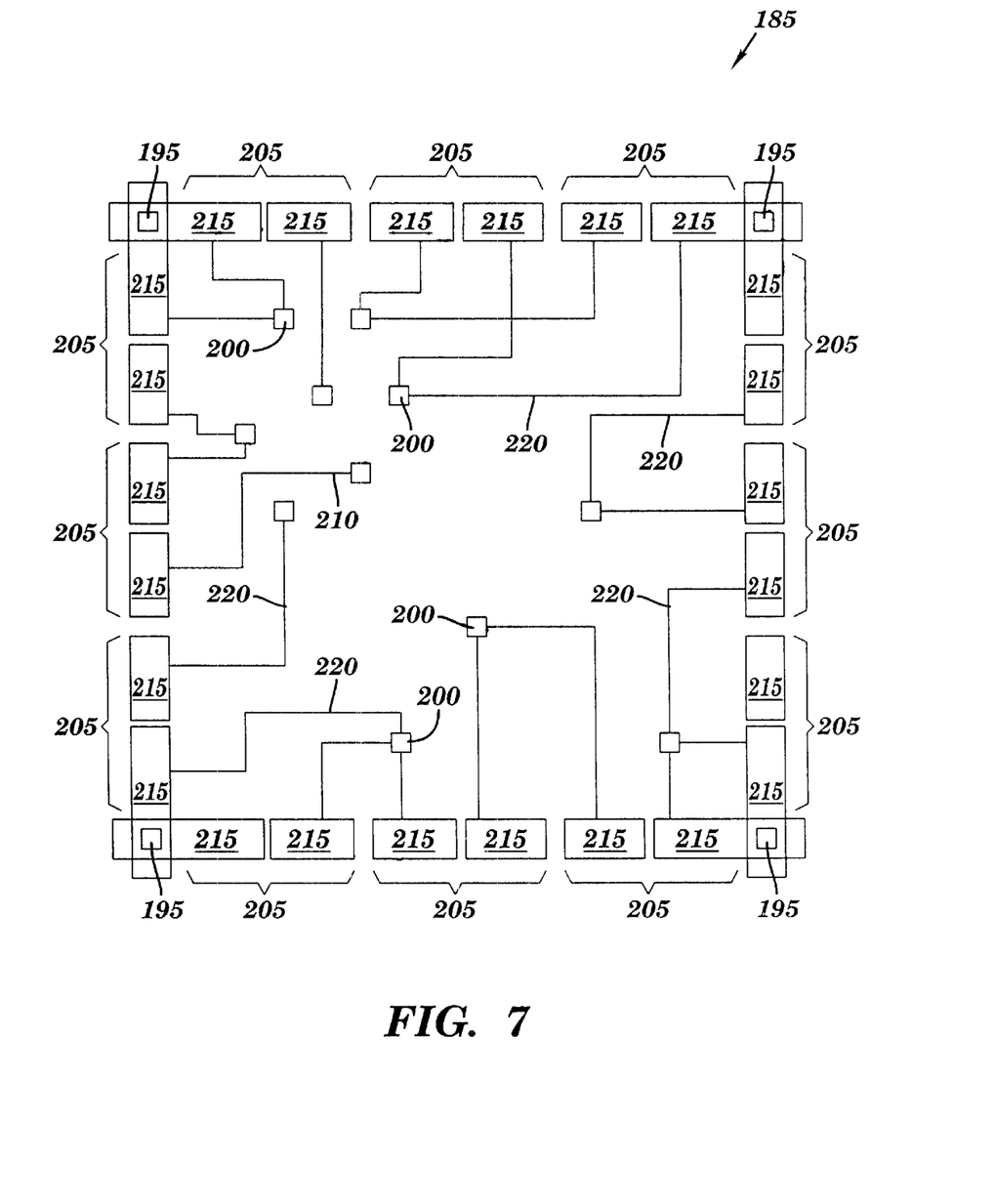
FIG. 7 is a schematic diagram, illustrating step 170 of FIG. 2 according to the present invention.

FIG. 7 is a schematic diagram, illustrating step 170 of FIG. 2 according to the present invention. In FIG. 7, each segment 205 is divided into a multiplicity of pin shapes 215 and the potential PST to segment connections 215 (FIG. 6) are converted to potential PST to pin shape connections 220. In the present example, each segment 205 is divided into two pin shapes 215.

Figure 8:
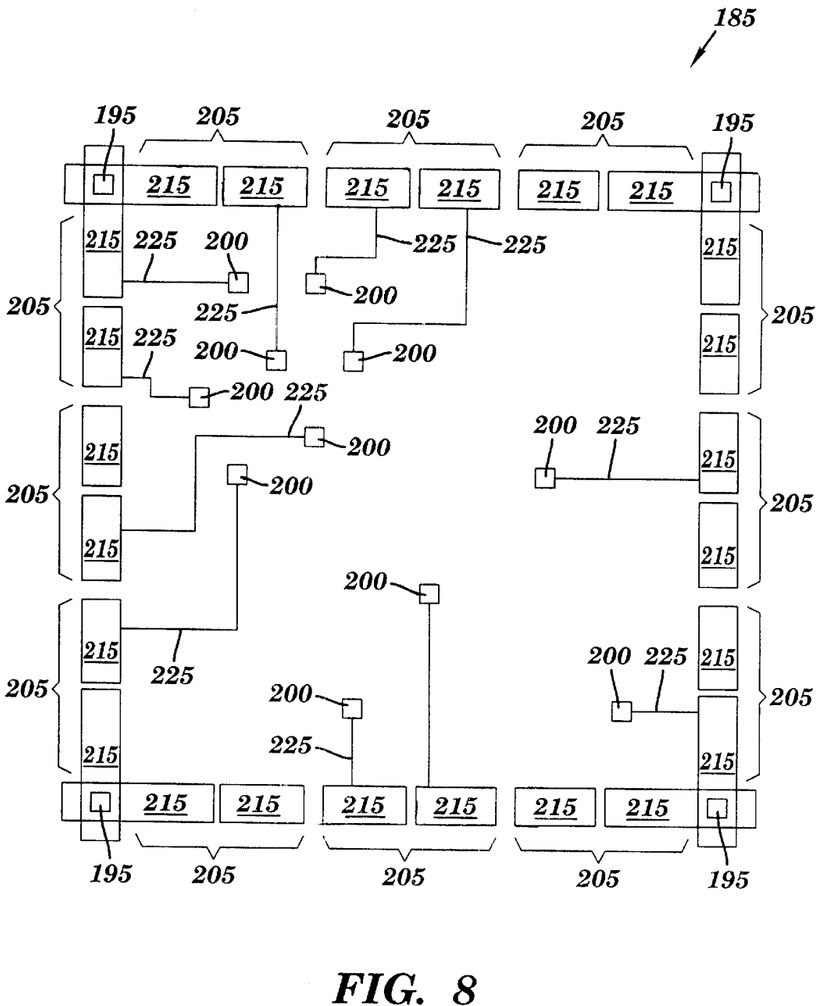
FIG. 8 is a schematic diagram, illustrating step 175 of FIG. 2 according to the present invention.

FIG. 8 is a schematic diagram, illustrating step 175 of FIG. 2 according to the present invention. In FIG. 8, an auto-router is used to select and implement one actual PST to pin shape connection 225 for each PST 200 from all the potential PST to pin shape connections 220 (FIG. 7) for each PST. Only one PST 200 is connected to any given pin shape 215 and thus, only eleven pin shapes are used.

Figure 9:
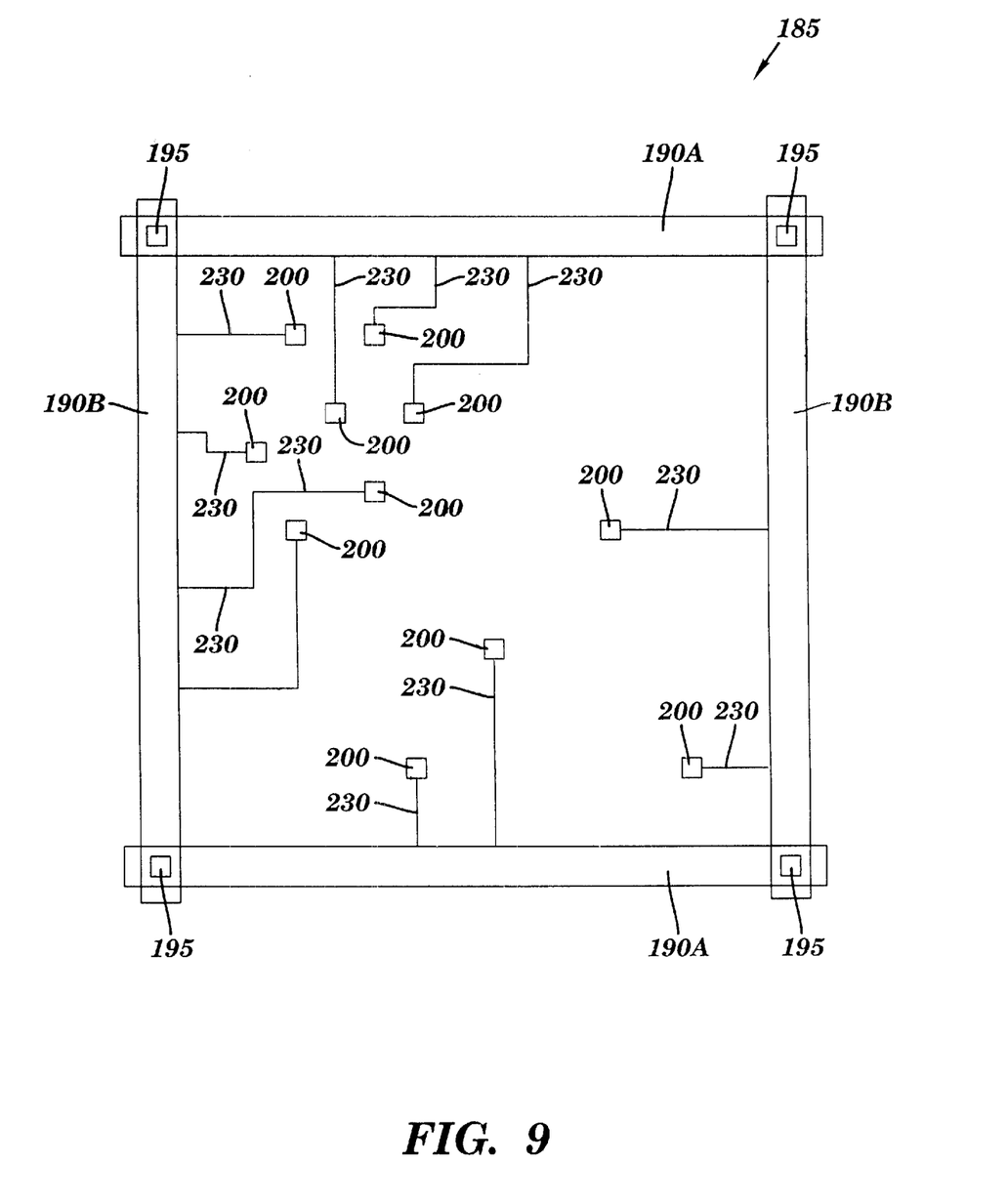
FIG. 9 is a schematic diagram, illustrating step 180 of FIG. 2 according to the present invention.

FIG. 9 is a schematic diagram, illustrating step 180 of FIG. 2 according to the present invention. In FIG. 9, sections 190A and 190B are re-formed. Each PST 200 has a PST to power ring connection 230 to power ring 185.

Figure 10:
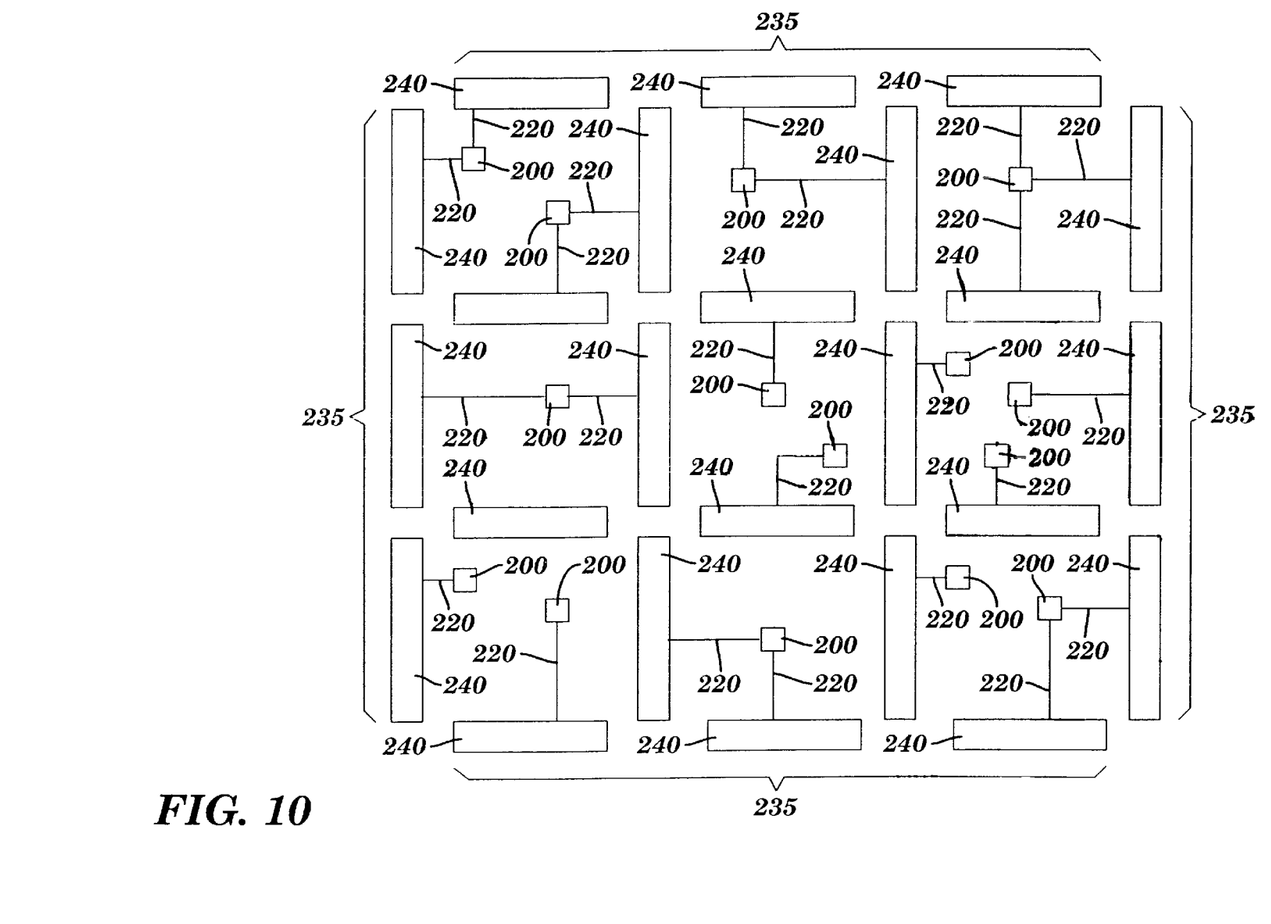
FIG. 10 is a schematic diagram, the method of the present invention wherein the power network is a grid.

FIG. 10 is a schematic diagram, the method of the present invention wherein the power network is a grid. Specifically step 170 of FIG. 2 is illustrated in FIG. 10. In FIG. 10, grid sections 235 are divided into pin shapes 240 and potential PST to pin shape connections 220 created between the pin shapes and PST's 200. Preceding and following steps are essentially the same as for the power ring example previously described.

Figure 11:
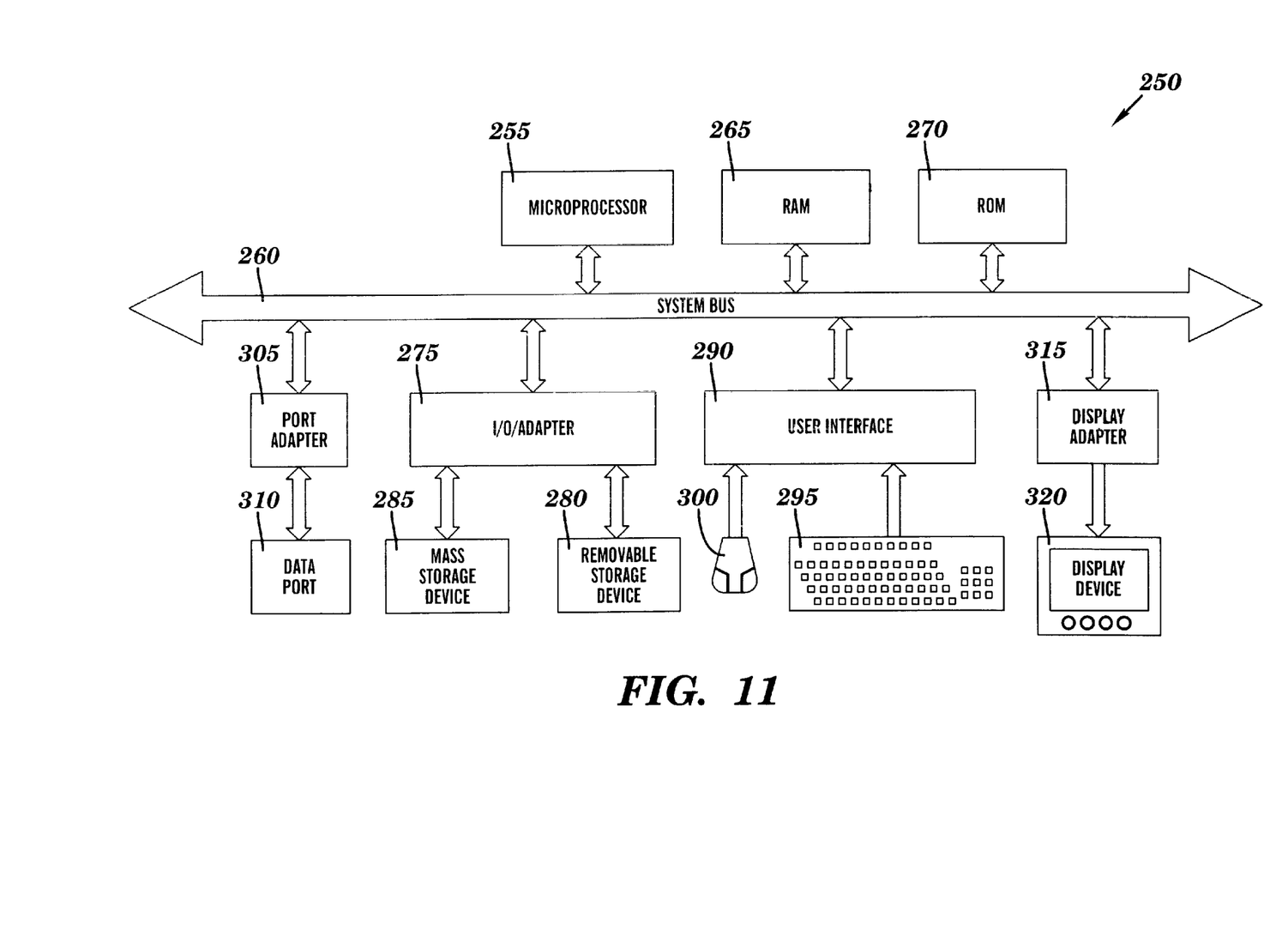
FIG. 11 is a schematic block diagram of a general-purpose computer for practicing the present invention.

Generally, the method described herein with respect to of wiring power service terminals to a power grid in a semiconductor integrated circuit is practiced with a general-purpose computer and the method may be coded as a set of instructions on removable or hard media for use by the general-purpose computer. FIG. 11 is a schematic block diagram of a general-purpose computer for practicing the present invention. In FIG. 11, computer system 250 has at least one microprocessor or central processing unit (CPU) 255. CPU 255 is interconnected via a system bus 260 to a random access memory (RAM) 265, a read-only memory (ROM) 270, an input/output (I/O) adapter 275 for a connecting a removable data and/or program storage device 280 and a mass data and/or program storage device 285, a user interface adapter 290 for connecting a keyboard 295 and a mouse 300, a port adapter 305 for connecting a data port 310 and a display adapter 315 for connecting a display device 320.

ROM 270 contains the basic operating system for computer system 250. Examples of removable data and/or program storage device 280 include magnetic media such as floppy drives: and tape drives and optical media such as CD ROM drives. Examples of mass data and/or program storage device 285 include hard disk drives and non-volatile memory such as flash memory. In addition to keyboard 295 and mouse 300, other user input devices such as trackballs, writing tablets, pressure pads, microphones, light pens and position-sensing screen displays may be connected to user interface 290. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 280, fed through data port 310 or typed in using keyboard 295.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of routing power from a power network to one or more power service terminals within a voltage island, comprising: dividing said power network into segments; creating power service terminal to segment connections based on a first set of criteria; removing selected power service terminal to segment connections based on a second set of criteria; and selecting one power service terminal to segment connection for each said power service terminal.

2. The method of claim 1, further including: dividing said segments into pins shapes such that no more than one power service terminal is connected to any said pin shape.

3. The method of claim 2, wherein the number of pin shapes each segment is divided into is equal to the number of power service terminals connected to that pin shape.

4. The method of claim 1, wherein said first criteria is selected from the group consisting of power drop, wire length, wire size, wiring layer restrictions and combinations thereof.

5. The method of claim 1, wherein said second set of criteria is electro-migration criterion and one other criteria selected from the group consisting of wire length and current.

6. The method of claim 1, wherein said power network is selected from the group consisting of power rings and power grids.

7. The method of claim 1, wherein the step of selecting one power service terminal to segment connection for each said power service terminal is performed using an auto-router.

8. A computer system comprising a processor, an address/data bus coupled to said processor, and a computer-readable memory unit coupled to communicate with said processor, said memory unit containing instructions that when executed implement a method for routing power from a power network to one or more power service terminals within a voltage island, said method comprising the computer implemented steps of: dividing said power network into segments, creating power service terminal to segment connections based on a first set of criteria; removing selected power service terminal to segment connections based on a second set of criteria; and selecting one power service terminal to segment connection for each said power service terminal.

9. The computer system of claim 8, further including the computer implemented step of: dividing said segments into pins shapes such that no more than one power service terminal is connected to any said pin shape.

10. The computer system of claim 9, wherein the number of pin shapes each segment is divided into is equal to the number of power service terminals connected to that pin shape.

11. The computer system of claim 8, wherein said first criteria is selected from the group consisting of power drop, wire length, wire size, wiring layer restrictions and combinations thereof.

12. The computer system of claim 8, wherein said second set of criteria is electro-migration criterion and one other criteria selected from the group consisting of wire length and current.

13. The computer system of claim 8, wherein said power network is selected from the group consisting of power rings and power grids.

14. The computer system of claim 8, wherein the computer implemented step of selecting one power service terminal to segment connection for each said power service terminal is performed using an auto-router.

15. A program storage device readable by machine, tangibly embodying a program of instructions executable by the machine to perform method steps for routing power from, a power network to one or more power service terminals within a voltage island said method steps comprising: dividing said power network into segments; creating power service terminal to segment connections based on a first set of criteria; removing selected power service terminal to segment connections based on a second set of criteria; and selecting one power service terminal to segment connection for each said power service terminal.

16. The program storage device of claim 15, further including the method step of: dividing said segments into pins shapes such that no more than one power service terminal is connected to any said pin shape.

17. The program storage device of claim 16, wherein the number of pin shapes each segment is divided into is equal to the number of power service terminals connected to that pin shape.

18. The program storage device of claim 15, wherein said first criteria is selected from the group consisting of power drop, wire length, wire size, wiring layer restrictions and combinations thereof.

19. The program storage device of claim 15, wherein said second set of criteria is electro-migration criterion and one other criteria selected from the group consisting of wire length and current.

20. The program storage device of claim 15, wherein said power network is selected from the group consisting of power rings and power grids.

21. The program storage device of claim 15, wherein the method step of selecting one power service terminal to segment connection for each said power service terminal is performed using an auto-router.

* * * * *